United States Patent [19]

Mester

[11] Patent Number: 4,951,282
[45] Date of Patent: Aug. 21, 1990

[54] METHOD AND APPARATUS FOR MEASURING THE QUALITY OF DIGITAL SIGNALS

[75] Inventor: Roland Mester, Darmstadt, Fed. Rep. of Germany

[73] Assignee: Robert Bosch GmbH, Stuttgart, Fed. Rep. of Germany

[21] Appl. No.: 234,910

[22] Filed: Aug. 22, 1988

[30] Foreign Application Priority Data

Sep. 5, 1987 [DE] Fed. Rep. of Germany ....... 3729882

[51] Int. Cl.$^5$ ..................... G11B 20/18; G11B 15/467
[52] U.S. Cl. ....................................... 371/5.1; 360/25; 360/77.12; 371/5.5; 377/50
[58] Field of Search ................... 360/53, 77.01, 77.04, 360/77.12, 25, 31; 369/43, 53; 371/4, 5.1, 5.5; 377/49, 50

[56] References Cited

U.S. PATENT DOCUMENTS 4,255,807 3/1981 Cosby .............................. 360/25 X

OTHER PUBLICATIONS

"Proposed American National Standard for Component Digital Video Recording"-19-mm type D-1 Cassette-Tape Record, pp. SMPTE224M to STPTE228M.

*Primary Examiner*—Jerry Smith
*Assistant Examiner*—Stephen M. Baker
*Attorney, Agent, or Firm*—Frishauf, Holtz, Goodman & Woodward

[57] ABSTRACT

A PROM has inupts from error detecting and processing equipment of the signal reproducing channels of equipment reproducing digital signals from magnetic tape and can be controlled to process selectively the recognition of errors and of their respective natures by the error detecting and correcting circuits. The error detection circuits also provide a block end signal at the end of every block of data of the digital signal being processed which is protected against errors by check words. At every block end signal the output of the PROM is transferred to a first register, the contents of which are made available to an adder for adding these contents to the contents of the second register (10) and the output of the adder is written into the second register, either without change or after division by two by a switch (12), to the output of the second register. A third register controls the extent counting of a counter (13) which counts out a set number of block end signals before putting the switch for one interval into its division by two position and at substantially the same time transferring the contents of the third register to other equipment which may be used to adjust the counter to maintain the contents of the register 10 within its mid range, in effect by controlling the intervals over which averaging the error information is performed. The evaluated output of the third register is an indication of the quality of the digital signal. That indication may be used to optimize tracking adjustments of the tape reading equipment, optimizing adjustments of a distortion corrector, or the like, as well as observing the quality of the tape recording.

13 Claims, 2 Drawing Sheets a) to c) TABLES for PROM 8

| ERRORS | | ERROR PATTERNS | |
|---|---|---|---|
| CORRECTABLE AVERAGE | UNCORRECTABLE ERROR WEIGHTING | No. of ERROR BITS | WEIGHT | a)
| | | | |
|---|---|---|---|
| 1 | | 0 | 0 |
| 1 | | 1 | 1 |
| 1 | | 2 | 2 |
| 1 | | 3 | 3 |
| 1 | | 4 | 4 |
| ⋮ | | ⋮ | ⋮ |
| 1 | | 8 | 8 |
| | 1 | – | 32 | b) WEIGHTING OF SINGLE ERRORS
| | | | |
|---|---|---|---|
| 1 | | 0 | 0 |
| 1 | | 1 | 1 |
| 1 | | 2 | 4 |
| 1 | | 3...8 | 0 |
| | 1 | – | 0 | c) WEIGHTING OF BURST ERRORS
| | | | |
|---|---|---|---|
| 1 | | 0 | 0 |
| 1 | | 1...3 | 0 |
| 1 | | 4 | 1 |
| 1 | | 5 | 2 |
| 1 | | 6 | 4 |
| 1 | | 7 | 8 |
| 1 | | 8 | 16 |
| | 1 | – | 32 | d) A SINGLE ERROR IN AN ERROR PATTERN

METHOD AND APPARATUS FOR MEASURING THE QUALITY OF DIGITAL SIGNALS

CROSS-REFERENCES TO RELATED PENDING APPLICATIONS

Ser. No. 193,903, Jurgen Heitmann et al, filed May 13, 1988;

Ser. No. 198,135, Roland Mester et al, filed May 24, 1988;

Ser. No. 198,133; Jurgen Heitmann, filed May 24, 1988, U.S. Pat. No. 4,875,106;

Ser. No 198,131, Roland Mester, filed May 24, 1988, U.S. Pat. No. 4,914,661;

Ser. No. 201,484, Roland Mester et al, filed June 1, 1988, U.S. Pat. No. 4,905,099;

Ser. No. 202,192, Hannfried Preissler, filed June 2, 1988, U.S. Pat. No. 4,918,694;

Ser. No. 204,194, Rolf Hedtke, filed June 8, 1988, U.S. Pat. No. 4,907,181;

Ser. No. 204,622, Rolf Hedtke et al, filed June 9, 1988.

This invention concerns measurement of the quality of digital signals and particularly the quality of such signals reproduced from magnetic tape.

A now widely known method of recording video signals is described in the following publications:

"Standard for Recording Digital Television Signals on Magnetic Tape in Cassettes" the European Broadcasting Union, TECH. 3252-E, and "Proposed American National Standard for Digital Video Recording", Society of Motion Picture and Television Engineers (SMPTE), 224M to 228M, and Fernsch- und Kinotechnik (periodical) 1987, Heft. ½, pages 15-22.

Substantial expense and complication is necessary for protection against errors in these known methods because of the high data rate of 227M bit/s and the high recording density in video tape recording. The circuits provided for dealing with errors include error recognition, error correction and error concealment and measures for making possible the separation of the data stream into individual signal segments for distribution among several tracks on the tape.

Up to a certain error rate the complete correction of reproduced signals is possible. Concealment of errors, so that they are invisible or barely visible in observing the reproduced picture is possible over a wider range of error rates. A disturbing deterioration of the reproduced pictures takes place only for signals very badly read out of the tape.

In order to correct errors in production of recorded signals check words are added to the data words in recording. In this way a double protection against errors is used which consists of supplying check words to a sequence of data words which form a code block, a number of these code blocks forming an imaginary data field of stacked code blocks so that the words form imaginary columns, and then likewise providing check words for the data word columns. The check words are determined in accordance with a Reed-Solomon code. The expressions "inner coding" and "outer coding" have been commonly applied to these respective kinds of error protection.

SUMMARY OF THE INVENTION

It is an object of the present invention to provide a method and apparatus for checking or monitoring the quality of reproduced digital signals on the basis of the occurrence of errors.

Briefly, error flags produced from error recognition circuits are summed over intervals of predetermined length and preferably summing is also done in such intervals for errors flagged as correctable or uncorrectable and/or errors conforming to particular error patterns. In particular the predetermined intervals are so controlled so that the error sums produced, as represented by binary numbers, remain within capacity of the registers and the like used to store and accumulate the sums.

The method and apparatus of the invention has the advantage that it is possible to provide monitoring of a digital video tape equipment even when no types of errors show up among the output signals of the video tape equipment. Although the invention is mainly directed to embodiment in digital tape equipment, its use is not limited to such apparatus, but can extend to all systems in which data are transmitted or stored and reproduced to the extent that error recognition circuits and sometimes also error correction circuits are provided.

It is particularly useful for the errors to be selected or classified according to their nature prior to summing, for example by determining whether correctable or uncorrectable errors are involved, and/or whether the errors belong to one or another of recognizable error patterns. By such means information is made available from which it can be concluded in the event of increased occurrence of errors, which part of the video tape equipment is not operating correctly.

Such information can, for example, be utilized for timely replacement of parts that are becoming worn out, for example magnetic heads. The information can also be used for recalibrating distortion compensation circuits. Thus, for example, from a spate of individual bit errors, it might be concluded among other things that a distortion compensator had been misaligned or misadjusted, with the result that a realignment or readjustment of this circuit may then be carried out under observation of the number of individual bit errors is while the occurence of multiple bit errors not taken into account in the summation.

In accordance with another elaboration of the invention, the predetermined intervals are so controlled that the reported sums of the errors lie within a region corresponding to the binary number capacity of registers, and the like, for the storage and processing of the sums. According to the condition of the tape and of the video tape equipment, the number of errors per unit of time can fluctuate very greatly. Determination of the error density over a constant interval can far exceed the range of count, for example, of an 8-bit word Furthermore, if it should be necessary to determine very small error densities with a sufficient accuracy, very long averaging intervals would be necessary which, however, would not be needed in the case of a greater error density.

The various features useful in connection with the invention are distinguished by relatively low circuit expense and complication and provide data that are well suited for further evaluation, for example with the help of microcomputer.

BRIEF DESCRIPTION OF THE DRAWINGS

The invention is further described by way of illustrative example with reference to the annexed drawings, in which:

FIG. 2 shows a table for weighting of the errors.

DESCRIPTION OF THE ILLUSTRATED EMBODIMENT

Figure 1:
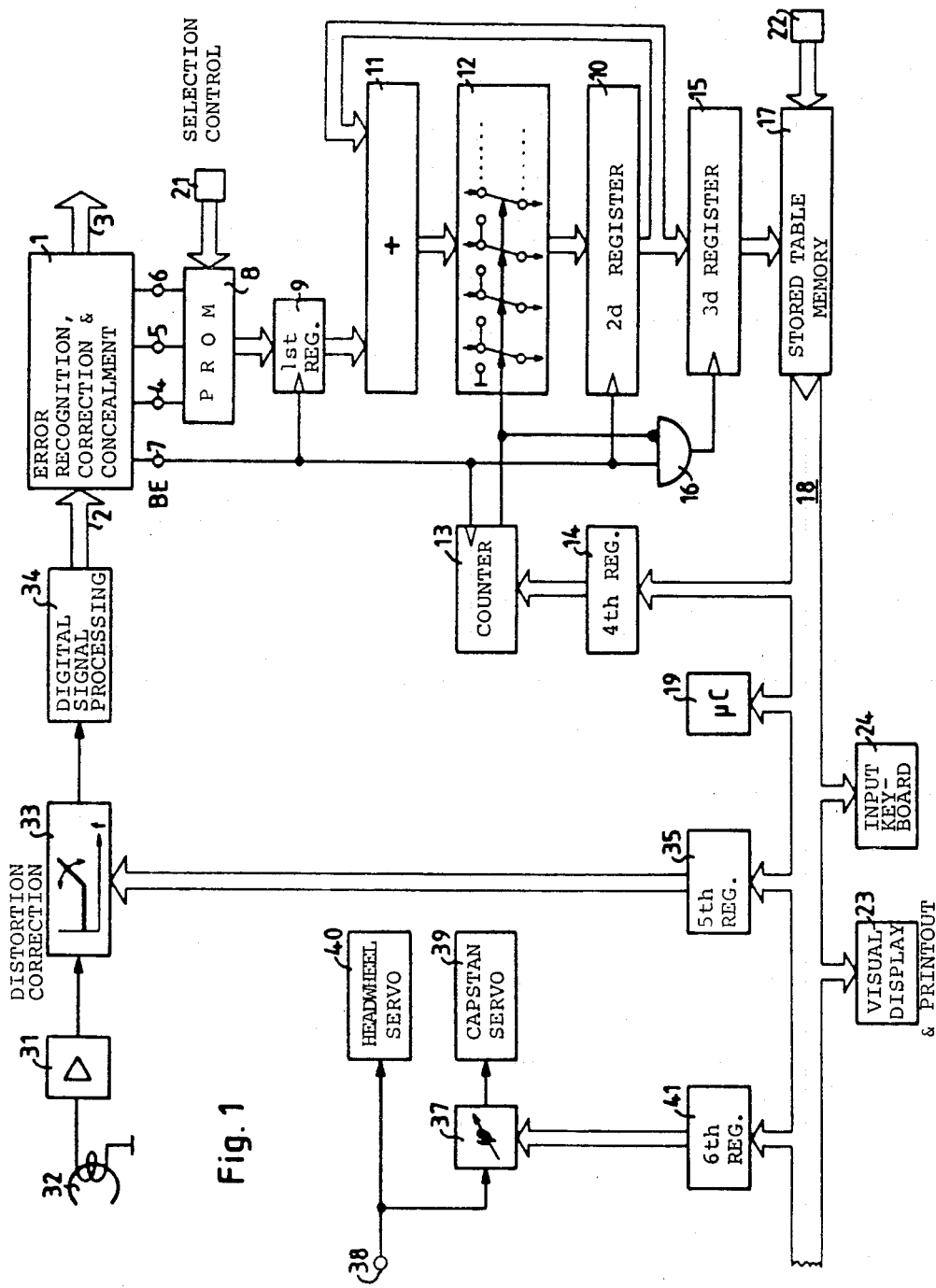
FIG. 1 is a circuit block diagram of an apparatus embodying the invention.

The circuit 1 in the upper right hand corner of FIG. 1 is a symbol-oriented, or byte-oriented error recognition and correction circuit, located in the reproduction channel of a digital magnetic tape recorder/reproducer. Such circuits are disclosed in the above cited article in Fernseh- und Kinotechnik, also in my above cross-referenced pending patent application Ser. No. 198,131 and with particular reference to digital audio signals, in the above cross-referenced pending patent application of Hannfried Priessler, Ser. No. 202,192.

Data not yet corrected are supplied at 2 to the circuit 1 and the corrected data are made available for further processing and/or display at the output 3. The circuit 1 also has additional outputs 4, 5, 6 and 7. A signal is provided at the output 4 whenever an uncorrectable error appears, whereas the appearance of a correctable error results in the provision of a corresponding signal at the output 5. The output 6 makes available, as an 8-bit wide data word, pattern of erroneous data words (bytes) or the number of erroneous bits in a block or in several successive blocks.

A block end signal BE is provided at the output 7 for designating the end of a currently completed data block.

The outputs 4, 5 and 6 are connected with address inputs of a memory 8 which is preferably a programmable read-only memory (PROM). A table is stored in the memory 8 on which data can be called out which relate only to particular varieties of errors by means of a variety designation signal applied to additional address inputs 21 of the memory 8. Stored data are supplied from the output of the memory 8 to the input of a first register 9 which is clocked with the block end signal BE.

The content of the first register 9 for every block interval is added to the content of a second register 10 in an addition circuit 11. The sum thus obtained is then written into the register 10. The addition circuit 11 and the second register 10 thus operate as an accumulator. Since the sums of the errors are nevertheless to be related to a time interval, the sum can be divided by 2 by action of a shift switch 12 which halves binary numbers by a one-place shift in the direction of the least significant bit. The number of times this shift takes place is controlled by a counter 13 in a manner dependent upon the magnitude of the frequency of error occurrence. For this purpose, the counter is clocked with the block end signal BE and on the other hand is set with an initial value which is taken from the averaging interval register 14.

Division by two is performed by means of the switching device 12—for example, with every block end signal BE for a very short averaging interval or more seldom when the averaging interval is to be greater. The content of the second register 10 is transferred to a third register 15 when the register 10 is clocked. The register 15 is clocked only through an AND gate 16 whenever a block end pulse BE coincides with a switching pulse supplied by the counter 13 to shift switch circuit 12, i.e., at the end of each averaging interval. This transfers the content of the register 15 to another memory 17 in which a table is stored by which the number of errors registered in the register 15 is evaluated. For example, subjective criteria may be included in this evaluation. Thus, the quality of the reproduced signals may be regarded as declining not only linearly with the number of necessary error concealments, but rather exponentially with regard to that number. This type of evaluation holds particularly for digital audio signals. The output of the memory 17 is connected to a bus system 18.

A microcomputer 19 is able to interrogate the output signals of the memory 17 over the bus system 18. When too many errors have been found in an initially selected averaging interval, a lower value for the averaging interval will be put into the averaging interval register 14 by the microcomputer 19. If, on the other hand, in the next selected averaging interval, so few errors occur that statistical evaluation is not possible, the averaging interval will be increased. The results of error reporting can for example be made visible by the computer 19 over the bus system 18 and through indicating device 23. An input unit 24 addressable by the microcomputer 19 can likewise be connected to the bus system 18.

Another manner of operating the system shown in FIG. 1 is to operate at first with a long averaging interval and allow the sum of errors to accumulate until it reaches a predetermined number selected so as not to be greater than half of the number which causes the register 15 to overflow and is preferably somewhat less than that. When the microprocessor 19 recognizes that such a number has been reached, the averaging interval can then be shortened so that the switch 12 will be operated at every block end signal BE.

Before other parts of the system shown in FIG. 1 are explained, the tables stored in the PROM 8 must first be explained with reference to FIG. 2, in which the portions (a), (b) and (c) of the table respectively represents three examples of tables, which, together, are stored in the PROM 8, each being selectable over the input 21.

Portion (a) of FIG. 2 shows a table with average weighting of errors so that the output signals of the PROM 8 have higher and higher values the more error locations are found to be present in an error pattern supplied through the output 6 of the error correction circuit 1. In this case, uncorrectable errors are weighted considerably more heavily, independently of how many error locations are found in an error pattern.

The portion 2(b) of FIG. 2 shows a table which is particularly suitable for detecting individually occurring errors. In the case of the error correction system of the digital video equipment mentioned in the introduction, one or two bit errors in a block are always correctable. For this reason, in the weighting according to FIG. 2(b), the uncorrectable errors are not taken into account. Hence in this case, errors are not taken into account in which three to eight erroneous bits occur in the error pattern. In the weighting according to FIG. 2(b), those errors are most heavily weighted in which two erroneous bits occur in an error pattern.

Another judgment criterion for the quality of the reproduced signal is the occurrence of errors which involve a considerable number of bits, the so-called burst errors. For the detection of such errors, the table illustrated in the portion 2(c) of FIG. 2 is suitable, in which correctable errors which involve one to three error bits per error pattern are not taken into account at all.

From four erroneous bits on the weighting rises: it should be doubled for every additional bit. The greatest weight goes to errors that are quite uncorrectable in a system that can handle a range of multibit errors.

When mention is made of an error bit in connection with the above-described portions of FIG. 2, this means that a bit in the error pattern has the value 1. The position of this error bit in such case is not taken into account. Thus, for example, all of the error patterns shown one below the other in portion (d) of FIG. 2, have one error bit. The corresponding treatment holds for two error bits and so on.

The table stored in the memory 17 makes possible in the first instance a correlation of the reported error count with quality classes. Thus, for instance, a division into two quality classes may be sufficient if it is desired to determine only whether a desired predetermined criterion is fulfilled or not fulfilled. For this purpose, it can for example be decided that when the register 15 has a content of less than 32 errors, a zero value will be provided at the output of the memory 17, which in this case means the error count does not overstep the prescribed criterion and that therefore the reproduced signals are good. In the case of a register content equal to or greater than 32, a value 1 can therefore be provided at the output of the memory 17, which signifies that the reproduced signals are worse than the prescribed criterion. If, for the evaluation in question, subdivision into two quality classes is not sufficient, it is possible to provide more quality classes, for example, "good" for less than 8 errors, "medium" for 8 to 31 errors and "bad" for 32 to 255 errors.

By means of a program stored in a microcomputer 19, the various evaluations can be made one after another so that with the help of an indicating device 23 continuous information regarding the quality of the reproduced signals and possibly prevent maladjustments for failures.

To return now to the arrangements provided in FIG. 1 that have not yet been described, these arrangements make it possible to carry out automatic calibration or adjustment by means of the embodiment of the invention here illustrated.

The amplifier 31 provided for amplifying the output signals of a magnetic head 32 is followed by a distortion compensator 33 provided in a manner already known.

The output of the distortion compensator 33 is connected through further circuits 34 to the already mentioned input of the error correction circuit 1. The circuits 34 include, in a known way, illustrated in the above-mentioned copending applications, circuits for quantization both in amplitude and in frequency range, circuits for regenerating clock pulses and circuits for serial to parallel conversion.

The frequency characteristic of the distortion compensation circuit 33, as symbolically shown in FIG. 1, can be modified by control signals supplied to the circuit from a register 35. For optimization of the distortion compensator frequency characteristic or equivalent transfer characteristic, a control signal changed by the microcomputer 19 while the number of one-bit errors and two-bit errors in data blocks are continuously reported. If the number of one-bit errors or two-bit errors rises, that denotes a change in the wrong direction, so that thereafter change in the other direction is produced, until the number of one-bit errors or two-bit errors rises again after a reduction. A corresponding program in the microcomputer 19 and an optimal value for the control signals can be found for supplying to the distortion compensation circuit 33. This value remains stored in the register 35 until the next checking of the situation. Such a recheck can be made at relatively long time intervals since what is involved are relatively slow stages or developments.

In a similar way, an optimization of tracking the tape record can be carried out. For that purpose, in a known way, a controllable phase shifter 37 is provided, with the help of which the phase position with reference pulses Href applied at 38 is shifted, before these pulses are supplied to the capstan servo 39. Since the reference pulses Href, by which the head wheel servo system 40 is controlled, is not affected by the phase shifter 37, control of the phase shifter 37 provides the possibility of controlling position of the tracks relative to the oblique scanning path of the magnetic heads on the head wheel.

The digital control signals supplied to the controllable phase shifter 37 are stored in a register 41, the content of which can be changed by the microcomputer 19 over the bus system 18. In the case of an optimization procedure which is otherwise similar to the optimization procedure for the distortion compensator 33, the so-called "burst errors" are principally taken into account.

Although the invention has been described with reference to particular illustrative examples, it will be understood that variations and modifications are possible within the inventive concept.

I claim:

1. Method of measuring the quality of a digital signal comprising data words and reproduced from a magnetic tape by an equipment having an error recognition circuit for tagging a signal portion containing an error with an error flag and error processing circuits for correcting correctable errors, concealing uncorrectable errors and identifying kinds of errors, and also having at least one binary number register used in registering the summing of errors detected by said error recognition circuit, said method comprising the steps of:

pre-setting the duration of intervals to be used successively for error occurrence information;

measuring the number of at least one kind of errors recognized in each of successive intervals of said pre-set duration and averaging the numbers so measured over a predetermined number of said intervals;

changing the presetting of the duration of said intervals in the event the average number of errors per interval is less than 1 or approximates the number corresponding to overflow of said at least one register, for maintaining said average number within the range of said at least one register.

2. Method according to claim 1, wherein said equipment includes means for identifying an error pattern by the rate of occurrence of detected errors in a predetermined number (n) of successive signal portions of equal length, wherein said method includes the step of selecting for measurement the rate of occurrences of a selected one of the following:

correctable errors, uncorrectable errors, single bit errors in respective signal portions which are error-protected by check words, and a particular level of multiple bit errors in said respective signal portions.

3. Method of measuring the quality of digital signals comprising data word blocks which respectively include check words for detecting and correcting errors, which is reproduced from magnetic tape by an equipment having error recognition, correction and concealment circuits, said method comprising the steps of:

pre-setting a number for an initial count of block end signals.

producing a block end signal (BE) at the end of every said block, and counting said block signals;

in response to each said block end signal, adding a number representing errors detected in said block to a previous error sum, if any, stored in a register (and in the absence of a previously stored sum adding said number to zero) and then writing the resulting sum in said register;

in response to the counting of said block end signals reaching said preset number, resetting the counting of block end signals and dividing by 2 the sum produced by adding said number representing detected errors to a previous sum in said register before the resulting sum is written into said register, and changing said preset number in response to the magnitude of said sum resulting when the counting of said block end signals reaches said preset number to an extent suitable for keeping the content of said register from overflowing while favoring the rise of said content into a midportion of the range of values storable in said register.

4. Method according to claim 3, wherein after said preset number is found to favor the rise of the content of said register into a high midportion of the said range, said step of dividing by 2 the addition result of an error count and a sum previously stored in said register before writing the resulting sum into said register is performed in response to the occurrence of every block end signal (BE).

5. Method of optimizing the operation of an equipment for reproducing a digital signal from a magnetic tape, said equipment having an error recognition circuit for tagging a signal portion containing an error with an error flag and also having at least one binary number register for use in registering the summing of error flags produced by the error recognition circuit, said method comprising the steps of:

re-setting the duration of intervals to be used successively for error occurrence information;

measuring the number of at least one kind of errors recognized in each of successive intervals of preset duration and averaging the number so measured over a predetermined number of said intervals;

changing the presetting of the duration of said intervals in the event the average number of errors in a said interval is less than 1 or approximates a number corresponding to overflow of said at least one register, for maintaining said average number within the range of said at least one register; and adjusting an operating parameter of said equipment for the purpose of optimizing adjustment of said operating parameter and then repeating the measurement of the number of at least one kind of errors recognized in each of successive intervals and averaging the number so measured over a predetermined number of said intervals, followed by further sequences of said adjustments and measurement/averaging steps, to determine an optimal adjustment of said parameter for which the average of numbers of errors so measured is at least approximately a minimum.

6. Method according to claim 5, wherein said adjustments are made for optimizing the tracking of the path of magnetic heads used for scanning magnetic tape with oblique tracks on said tape on which said digital signal is recorded.

7. Method according to claim 6, wherein a microcomputer is used having a stored program for varying tracking adjustment and measuring magnitude of change and the direction of change of the error rate and, in response to changes in the error rate, correcting the tracking adjustment.

8. Method according to claim 5, wherein the operating parameter of said equipment which is to be adjusted is a transfer characteristic of a distortion compensator having an adjustable transfer characteristic, whereby said transfer characteristic is optimized so as to produce a minimum in the measured error rate.

9. Method according to claim 8, wherein the error rate measured is the rate of occurrence of single bit errors in portions of a digital signal having a predetermined length, disregarding the occurrence of multiple bit errors occurring in data signal portions of said predetermined length.

10. Apparatus for measuring the quality of a digital signal comprising data words and reproduced from a magnetic tape by an equipment having an error recognition circuit for tagging a signal portion containing an error with an error flag and error processing circuits for correcting correctable errors, concealing uncorrectable errors and identifying kinds of errors, said apparatus further comprising:

an error selection circuit (8) for selecting at least one kind of error for measurement of the occurrence thereof, connected to said error recognition and processing circuits for receiving information on the occurrence of a plurality of kinds of errors and having a selection control circuit (21) for selecting at least one kind of errors for designating at an output of said selection circuit (8);

means for obtaining block end signals from said error recognition and processing circuits designating the end of each said digital signal portion capable of being tagged with an error flag;

a first register (9) for registering error information relating to each said digital signal portion under control of said error selection circuit (8), said first register being clocked by said block end signals for being cleared and for transferring its content in response to each block end signal, said content being transferred by an output of said first register;

a second register (10) and an adding circuit (11), said adding circuit being connected for adding the output of said first register to the output of said second register and having an output;

a controllable multi-bit changeover switch (12) having an input connected to the output of said addition circuit and an output connected to an input of said second register, said changeover switch being connected and controllable for providing to its output either the content of its input, or that content divided by 2 by virtue of a one-place shift towards the least significant bit, and means for controlling said switch in accordance with a settable variable number of said block end signals and thereby making it likely that the contents of said second register (10) will be in a mid range of its capacity for binary numbers.

11. Apparatus according to claim 10, wherein said means for controlling said switch comprise a counter connected for counting said block end signals and means (14) for setting said counter to count out a particular number of said block end signals to produce an output signal for controlling said switch (12) to produce division by two during the interval following each counting out operation which ends not later than the next block end signal.

12. Apparatus according to claim 11, wherein a third register (15) is provided having its input connected to an output of said second register (10) for transfer of content from said second register to said third register, said third register being arranged to be clocked for loading of content at substantially the same intervals at which said switch (12) is operated by said counter (13), and also a memory unit (17) having an input connected to the output of said third register and containing tabular stored information for evaluation of information obtained from said third register 15 and furnishing it for controlling said means (14) for setting the count length of said counter (13), said output of said memory 17, being also furnished to an output of the above defined apparatus.

13. Apparatus according to claim 10, wherein said selection circuit (8) comprises a programmable read only memory (PROM).

* * * * *